(12) United States Patent
Melkote et al.

(10) Patent No.: US 8,401,863 B1
(45) Date of Patent: Mar. 19, 2013

(54) AUDIO ENCODING AND DECODING WITH CONDITIONAL QUANTIZERS

(75) Inventors: Vinay Melkote, San Mateo, CA (US); Charles Q. Robinson, Piedmont, CA (US)

(73) Assignee: Dolby Laboratories Licensing Corporation, San Francisco, CA (US)

(*) Notice: Subject to any disclaimer, the term of this patent is extended or adjusted under 35 U.S.C. 154(b) by 0 days.

(21) Appl. No.: 13/560,144

(22) Filed: Jul. 27, 2012

Related U.S. Application Data

(60) Provisional application No. 61/638,090, filed on Apr. 25, 2012.

(51) Int. Cl.
*G10L 21/00* (2006.01)
(52) U.S. Cl. .......................... 704/500; 704/230; 375/240
(58) Field of Classification Search .................. 704/230, 704/500; 375/240
See application file for complete search history.

(56) References Cited

U.S. PATENT DOCUMENTS

| | | | | |
|---|---|---|---|---|
| 5,812,971 A | * | 9/1998 | Herre | 704/230 |
| 2004/0002856 A1 | * | 1/2004 | Bhaskar et al. | 704/219 |
| 2006/0074693 A1 | * | 4/2006 | Yamashita | 704/500 |
| 2009/0048847 A1 | * | 2/2009 | Jung et al. | 704/500 |

OTHER PUBLICATIONS

Fielder, Louis D. et al., "Introduction to Dolby Digital Plus, an Enhancement to the Dolby Digital Coding System," presented at the 117th Convention Audio Engineering Society, Oct. 28-31, 2004, San Francisco, CA.

* cited by examiner

*Primary Examiner* — Daniel D Abebe
(74) *Attorney, Agent, or Firm* — Weaver Austin Villeneuve & Sampson LLP

(57) ABSTRACT

Some methods may involve receiving a frame of encoded audio data that includes transform coefficient data. The transform coefficient data may include exponent data and mantissa data. The mantissa data may include mantissa values that were encoded with uniform or non-uniform boundaries of quantization intervals. The mantissa values may be reconstructed based, at least in part, on exponent profile data. Based on the exponent profile data, statistics regarding the pre-quantization mantissas values may be inferred. The exponent profile data may include exponent differential data. Some such exponent differential data may be exponent difference pairs, though more than two exponent differential data points may be evaluated in alternative methods. At each frequency bin, mantissa value reconstruction may be conditioned on the exponent differential data, e.g., on the exponent difference pairs.

30 Claims, 12 Drawing Sheets

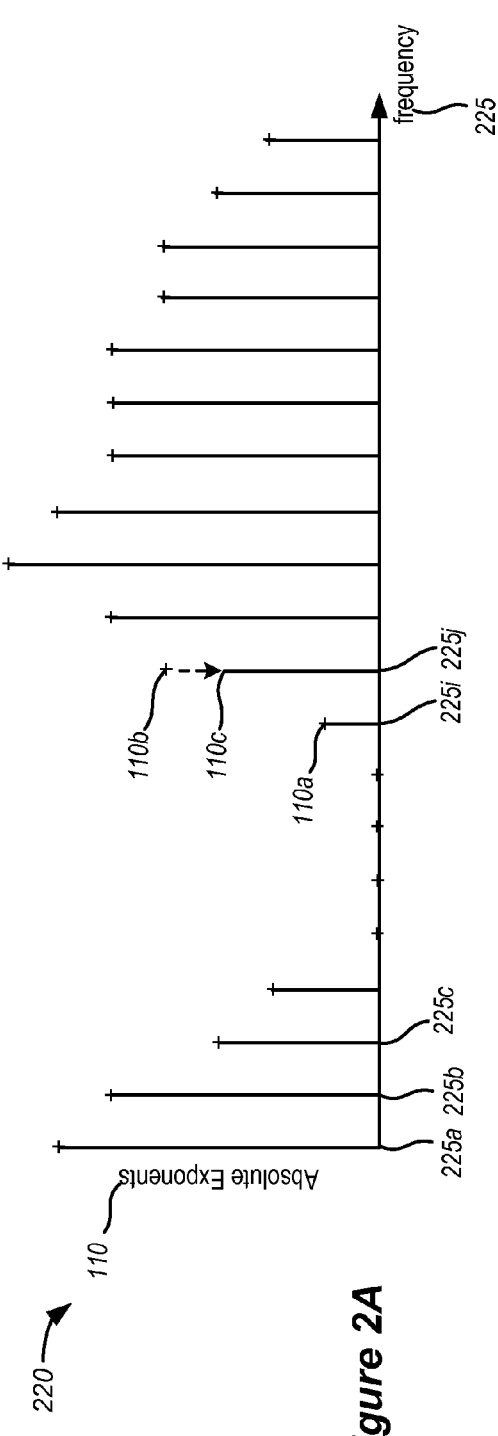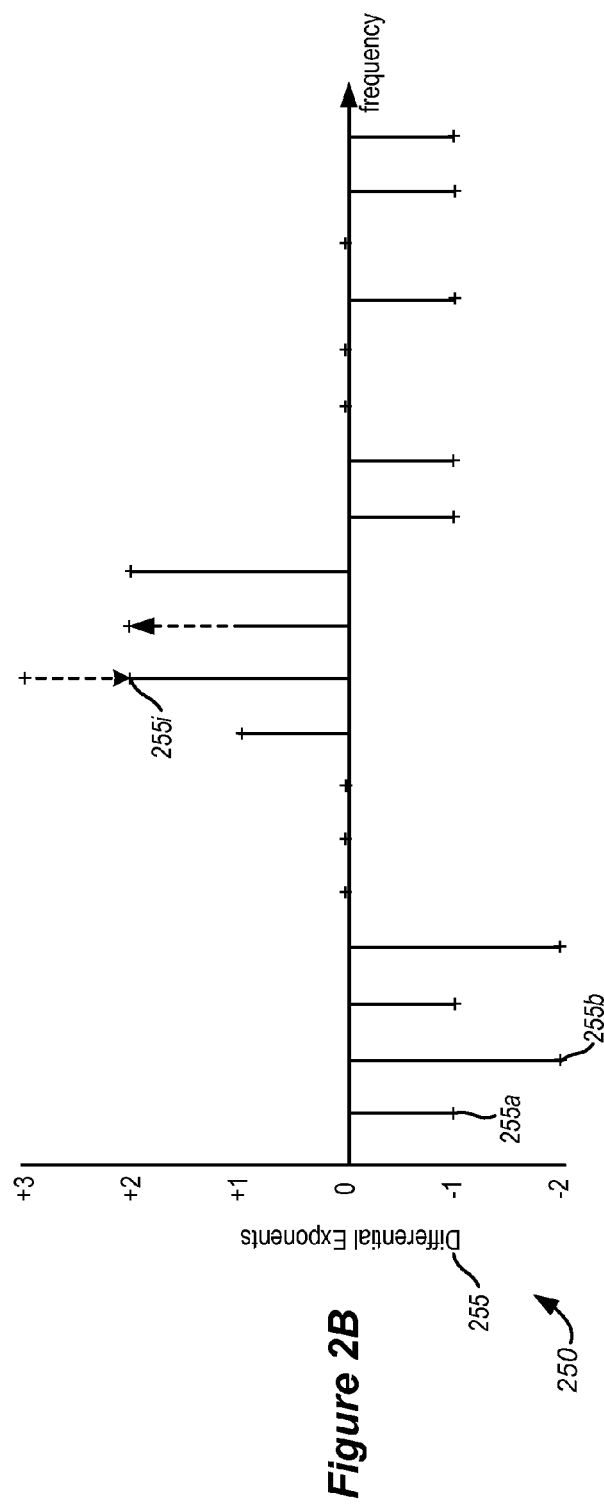

AUDIO ENCODING AND DECODING WITH CONDITIONAL QUANTIZERS

PRIORITY CLAIM

This application claims priority to U.S. Provisional Application No. 61/638,090, entitled "AUDIO ENCODING AND DECODING WITH CONDITIONAL QUANTIZERS" and filed on Apr. 25, 2012, which is hereby incorporated by reference and for all purposes.

TECHNICAL FIELD

This disclosure relates to encoding an audio signal or decoding an encoded audio signal. In particular, this disclosure relates to quantization and inverse quantization processes.

BACKGROUND

The development of digital encoding and decoding processes for audio and video data continues to have a significant effect on the delivery of entertainment content. Despite the increased capacity of memory devices and widely available data delivery at increasingly high bandwidths, there is continued pressure to minimize the amount of data to be stored and/or transmitted. Audio and video data are often delivered together, and the bandwidth for audio data is often constrained by the requirements of the video portion.

Accordingly, audio data are often encoded at high compression factors, sometimes at compression factors of 30:1 or higher. Because signal distortion increases with the amount of applied compression, trade-offs may be made between the fidelity of the decoded audio data and the efficiency of storing and/or transmitting the encoded data.

Moreover, it is desirable to reduce the complexity of the encoding and decoding algorithms. Encoding additional data regarding the encoding process can simplify the decoding process, but at the cost of storing and/or transmitting additional encoded data. Therefore, in parametric backward adaptive methods, the bit allocation data for each mantissa are not encoded. Instead, the decoder must re-compute the bit allocation data from other encoded information. Such methods allow less data to be encoded, but involve relatively greater complexity on the decoder side. Similarly, while lossy mantissa encoding processes allow significant data compression, some information about the original mantissa values is lost in the encoding process, particularly during the mantissa quantization process. Although existing audio encoding and decoding methods are generally satisfactory, improved methods would be desirable.

SUMMARY

Some aspects of the subject matter described in this disclosure can be implemented in encoding or decoding methods. Some such methods may involve receiving a frame of encoded audio data that includes transform coefficient data. The transform coefficient data may include exponent data and mantissa data. The mantissa data may include mantissa values that were encoded with uniform or non-uniform boundaries of quantization intervals. The mantissa values may be reconstructed based, at least in part, on information about the exponents. Such information may be referred to herein as exponent profile data. Based on the exponent profile data, statistics regarding the pre-quantization mantissas values may be inferred.

According to some implementations, the exponent profile data may include exponent differential data. Some such exponent differential data may be exponent difference pairs, though more than two exponent differential data points may be evaluated in alternative implementations. At each frequency bin, mantissa value reconstruction may be conditioned on the exponent differential data, e.g., on the exponent difference pairs.

Some methods described herein involve receiving an encoded frame that includes audio data and determining quantizer resolution data in response to information extracted from the encoded frame. The quantizer resolution data may correspond to a number of quantization intervals used during a process of quantizing mantissa values of transform coefficients for the audio data of the encoded frame. The method may involve determining exponent profile data of transform coefficients from the encoded frame and determining a plurality of dequantization methods for the mantissa values of the encoded frame based, at least in part, on the quantizer resolution data and the exponent profile data The method also may involve dequantizing the mantissa values according to the dequantization methods.

The exponent profile data may include exponent differential data. In some such implementations, the exponent differential data may correspond to 5 differential states. The exponent differential data may, for example, include exponent difference pairs. Dequantizing the mantissa values may involve dequantizing a mantissa value for a frequency according to a dequantization method that corresponds to an exponent difference pair for the frequency. The exponent difference pair for the frequency may include a first exponent difference relative to an exponent for a lower frequency and a second exponent difference relative to an exponent for a higher frequency.

In some implementations, the quantization intervals used during the process of quantizing mantissa values may be uniform quantization intervals. However, in other implementations, the quantization intervals may not be uniform quantization intervals. The quantization values used during the process of quantizing mantissa values may, in some implementations, correspond to midpoints between boundaries of quantization intervals. However, at least some dequantization values may not correspond to midpoints between the boundaries of quantization intervals.

At least some of the dequantization methods may involve the application of dequantization values different from the quantization values used during the process of quantizing mantissa values of the encoded frame. In some implementations, the exponent profile data may include data for exponents for which there are no corresponding mantissa values in the encoded frame.

Some implementations described herein provide an apparatus that includes one or more interfaces and a logic system. The logic system may include one or more of a general purpose single- or multi-chip processor, a digital signal processor (DSP), an application specific integrated circuit (ASIC), a field programmable gate array (FPGA) or other programmable logic device, discrete gate or transistor logic or discrete hardware components. The logic system may be configured for receiving, from the interface, an encoded frame that includes audio data and for determining quantizer resolution data in response to information extracted from the encoded frame. The encoded frame may be in one of various formats, such as the AC-3 format or the Enhanced AC-3 format. The quantizer resolution data may correspond to a number of quantization intervals used during a process of quantizing mantissa values of transform coefficients for the audio data of the encoded frame.

The logic system also may be configured for determining exponent profile data of transform coefficients from the encoded frame. The logic system may be configured for determining a plurality of dequantization methods for the mantissa values of the encoded frame based, at least in part, on the quantizer resolution data and the exponent profile data. The logic system also may be configured for dequantizing the mantissa values according to the dequantization methods.

The apparatus may include a memory device. The interface may be an interface between the logic system and the memory device. Alternatively, or additionally, the interface comprises a network interface.

In some implementations, the exponent profile data may include exponent differential data. For example, the exponent differential data may include exponent difference pairs corresponding to each of a plurality of frequencies. In some such implementations, the apparatus includes a memory having a data structure stored thereon. The data structure may include a plurality of dequantization methods and corresponding exponent differential data. The logic system may be configured for determining a dequantization method corresponding to exponent differential data by referencing the data structure.

Some implementations described herein may be implemented in a non-transitory medium having software stored thereon. The software may include instructions for controlling a decoding apparatus to receive an encoded frame that includes audio data and to determine quantizer resolution data in response to information extracted from the encoded frame. The quantizer resolution data may correspond to a number of quantization intervals used during a process of quantizing mantissa values of transform coefficients for the audio data of the encoded frame.

The software may include instructions for controlling the decoding apparatus to determine exponent profile data of transform coefficients from the encoded frame and to determine a plurality of dequantization methods for the mantissa values of the encoded frame based, at least in part, on the quantizer resolution data and the exponent profile data. The software may include instructions for controlling the decoding apparatus to dequantize the mantissa values according to the dequantization methods.

Alternative methods are provided herein. Some such methods may involve receiving first audio data in the time domain and transforming the first audio data into second audio data in the frequency domain. The second audio data may include transform coefficients. The methods may involve determining exponent data, including exponent profile data, from the transform coefficients and determining quantizer resolution data in response to the exponent data. The quantizer resolution data may correspond to a number of quantization intervals to be used during a process of quantizing mantissa values of the transform coefficients. The methods may involve determining a plurality of quantization methods for the mantissa values of the transform coefficients based, at least in part, on the quantizer resolution data and the exponent profile data. The methods may involve quantizing the mantissa values according to the quantization methods.

The methods may involve forming an encoded frame that includes the second audio data, the exponent data and the quantized mantissa values. In some implementations, one or more quantization values used during the process of quantizing mantissa values may not correspond to a midpoint between boundaries of a quantization interval. One or more of the quantization methods may use quantization intervals with boundaries that are not uniformly spaced.

Alternative aspects of the disclosure may be implemented in an apparatus that includes at least one interface and a logic system. The logic system may be configured for receiving, from an interface, an encoded frame that includes first audio data in the frequency domain, exponent data and quantized mantissa values. The quantized mantissa values may be determined according to quantization methods based, at least in part, on quantizer resolution data and exponent profile data determined from the exponent data.

The logic system may be configured for determining dequantized mantissa values from the quantized mantissa values, for determining transform coefficients based in part on the dequantized mantissa values and for performing an inverse transform operation using the transform coefficients to produce second audio data in the time domain.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIG. 2A is a graph that shows the results of one example of an exponent tenting process on absolute exponent values.

FIG. 2B is a graph that shows differential exponent values.

Like reference numbers and designations in the various drawings indicate like elements.

DESCRIPTION OF EXAMPLE EMBODIMENTS

The following description is directed to certain implementations for the purposes of describing some innovative aspects of this disclosure, as well as examples of contexts in which these innovative aspects may be implemented. However, the teachings herein can be applied in various different ways. Although the examples provided in this application are primarily described in terms of the AC-3 audio codec (also known as "Dolby Digital"), and the Enhanced AC-3 audio codec (also known as E-AC-3 or "Dolby Digital Plus"), the concepts provided herein apply to other audio codecs, including but not limited to MPEG-2 AAC and MPEG-4 AAC. Moreover, the described implementations may be implemented in various audio encoders and/or decoders, which may be included in mobile telephones, smartphones, desktop computers, hand-held or portable computers, netbooks, notebooks, smartbooks, tablets, stereo systems, televisions, DVD players, digital recording devices and a variety of other devices. Accordingly, the teachings of this disclosure are not intended to be limited to the implementations shown in the figures and/or described herein, but instead have wide applicability.

Figure 1:
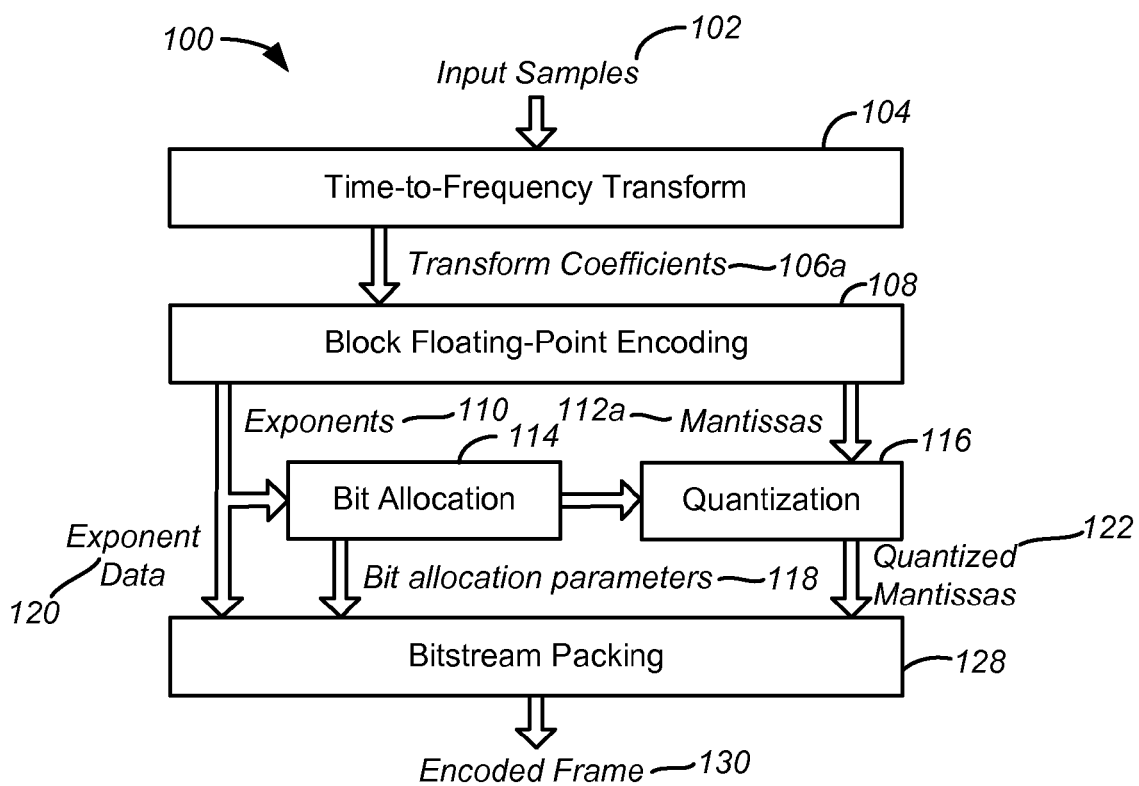
FIG. 1 is a flow diagram illustrating an example of an audio encoding process.

FIG. 1 is a flow diagram illustrating an example of an audio encoding process. The operations of the audio encoding process 100, like other processes shown and/or described herein, are not necessarily performed in the order indicated. Moreover, the processes provided herein may include more or fewer blocks than are shown and/or described. The audio encoding process 100 and other audio encoding and decoding processes described herein may be performed, at least in part, by audio encoders and/or decoders that can be implemented via hardware, firmware, software recorded on non-transitory media, etc. Some examples are described elsewhere herein.

In the audio encoding process 100, input samples 102 in the time domain are transformed into the frequency domain in the transform process 104. The input samples 102 may be grouped into audio data frames having multiple blocks in each frame. In some such examples, the transform process 104 involves a modified discrete cosine transform (MDCT) of the input samples 102 to produce the transform coefficients 106a. However, other transform methods (such as fast Fourier transforms or various analysis filterbanks, i.e., Quadrature Mirror Filterbanks (QMF)) may be used in alternative implementations. Blocks of the input samples 102 may be windowed and overlapped. The output from the transform process 104 may be constrained within certain values. For example, the output of an MDCT may be a "fractional representation" that is constrained between −1.0 and 1.0.

In the process 108, the fractional representation is converted to a floating point representation for subsequent processing. In some implementations, the output of process 108 may be transform coefficients having mantissa values and exponent values. In some such implementations, the output of the process 108 may be in the following form:

$$X = Y2^{-k}$$ [Equation 1]

In Equation 1, X represents the transform coefficient 106a, Y represents the mantissa value 112a and $k$ represents the exponent value 110 (see FIG. 1). In some implementations, the mantissa values 112a and the exponent values 110 may be constrained to fall within predetermined ranges. For example, for encoding with the AC-3 audio codec, the exponent values 110 may be greater than or equal to zero. The mantissa values 112a may be constrained to be greater than or equal to 0.5 and less than or equal to 1.0.

The exponent values 110 may be processed in a variety of ways before the process 128, wherein the exponent values 110 are included in an encoded frame 130 of audio data. In some implementations, the exponent values 110 may be grouped across time and/or frequency. Such grouping may be more desirable when the exponent values 110 are changing relatively slowly over time and/or across frequency.

For example, the exponent values 110 may be encoded with a single exponent value 110 for each frequency component (also referred to herein as a "bin" or a "frequency bin"), which may represent a range of frequencies. Alternatively, the exponent values 110 may be encoded with a single exponent value 110 for multiple bins (e.g., for 2, 4 or more bins). If the exponent values 110 are grouped across multiple frequency bins, the exponent values 110 corresponding to some of the bins may need to change. If so, the corresponding mantissa values 112a may be changed in order to maintain each of the transform coefficients 106a at an equivalent value.

Similarly, the exponent values 110 may or may not be grouped across time. If not, a different exponent value 110 may be encoded for each block. However, if a single exponent value 110 is shared across multiple blocks, some of the exponent values 110 in other blocks may need to change. If so, the corresponding mantissa values 112a may be changed in order to maintain an equivalent value for each transform coefficient 106a.

When the mantissa values 112a are changed in accordance with changes in the exponent values 110, it is desirable to do so in a lossless manner. In some implementations, if the mantissa values 112a were adjusted above a threshold value when the corresponding exponent values 110 are changed, the mantissa values 112a would be "clipped" to a maximum value (such as 1.0). Such "clipping" introduces signal distortion. Therefore, instead of adjusting the mantissa values 112a above a threshold value when the corresponding exponent values 110 are changed, it may be preferable to encode an equivalent value of the transform coefficient 106a that has a lower mantissa value 112a.

FIG. 2A is a graph that shows the results of one example of an exponent tenting process on absolute exponent values. In this example, the graph 220 depicts a sequence of absolute exponent values 110 and corresponding frequency bins 225. In this example, the differential between adjacent exponent values 110 is constrained to be less than ±12 dB. Here, the differential between exponent values 110a and 110b in adjacent bins 225i and 225j, respectively, exceeds 12 dB. Therefore, the exponent value for bin 225j is reduced from 110b to 110c as a result of this exponent tenting process. In this example, the corresponding mantissa value 112a is adjusted in order to maintain an equivalent value for the corresponding transform coefficient 106a.

FIG. 2B is a graph that shows differential exponent values. The differential exponent values 255 shown in graph 250 of FIG. 2B correspond to differences between the absolute exponent values of FIG. 2A after the exponent tenting process. For example, the differential exponent value 255a (−1) corresponds to the difference between the exponent value 110 of bin 225b and the exponent value 110 of bin 225a. The differential exponent value 255b (−2) corresponds to the difference between the exponent value 110 of bin 225c and the exponent value 110 of bin 225b.

In this example, the differential exponent values 255 are constrained to fall within a range from −2 to 2 and have 5 possible states: −2, −1, 0, 1 or 2. Therefore, the differential exponent value 255i (corresponding to the difference between the exponent value 110 of bin 225j and the exponent value 110 of bin 225i) has been reduced from 3 to 2. Referring again to FIG. 1, these differential exponent values 255 may be included in the exponent data 120 of the encoded frame 130 during the bitstream packing process 128. The exponent data 120 may include what is referred to herein as exponent profile data. In some implementations, exponent profile data may be derived from the exponent data 120. Some examples of using exponent profile data are described below.

Some examples of encoding the mantissa values 112a will now be described. Bit allocation process 114 may include determining an optimal quantizer resolution for each of the mantissa values 112a. For example, the number of bits needed for overhead, exponent encoding, etc., may be subtracted from the total number of bits available per frame. Power spectral density, an estimate of spectral energy for each bin, may be computed from the exponent values 110 or by using a reference exponent value and the differential exponent values 255.

A masking curve that accounts for the psychoacoustic properties of human hearing may be computed and compared to the power spectral density for each bin. In some such implementations, a masking curve will be applied to each of a plurality of frequency bands. The absolute thresholds of human hearing may also be applied.

A signal-to-mask ratio, which represents the difference between the power spectral density and the corresponding mask value for each bin, may be computed. In some implementations, a quantizer resolution may be based on the signal-to-mask ratio. For example, the quantizer resolution that is applied during the mantissa quantization process 116 may be proportional to the signal-to-mask ratio. In some implementations, the bit allocation parameters 118 that are included in the encoded frame 130 may correspond with this quantizer resolution. Accordingly, the bit allocation parameters 118 of the encoded frame 130 may include quantizer resolution data that correspond with a number of quantization intervals used during the mantissa quantization process 116. However, in alternative implementations the bit allocation parameters 118 are not included in the encoded frame 130. In parametric backward adaptive implementations such as Dolby Digital and Dolby Digital Plus, the bit allocation parameters 118 (or other data that correspond with quantizer resolution) may be computed by the decoder from exponent data, masking curve offset data, etc., included in the encoded frame. Such methods allow less data to be encoded, but involve relatively greater complexity on the decoder side.

In some implementations, only bits corresponding to those power spectral density values that exceed the masking curve values (or the absolute thresholds of human hearing) for each bin will be included in the encoded frame 130. However, the degree to which power spectral density values exceed the masking curve values may vary substantially over time. Therefore, the corresponding number of bits that could potentially be encoded may also vary substantially over time.

In order to compensate for such variety, some encoder implementations involve an iterative search to optimize the signal-to-mask ratio for the number of available bits. In some such implementations, if the number of bits that could potentially be encoded exceeds the number of available bits, the masking curve may be shifted up. If the number of bits that could potentially be encoded is less than the number of available bits, the masking curve may be shifted down. An optimal masking curve offset, which results in using as many bits as possible without exceeding the number of available bits, may be determined.

Some examples of mantissa quantization processes 116 will now be described. As noted above, the quantizer resolution of the mantissa quantization process 116 may be based on the signal-to-mask ratio. Some encoding implementations may involve a significant number of possible quantizer resolutions.

Dolby Digital, for example, includes 16 possible quantizer resolutions, each of which corresponds to a bit allocation pointer value. A bit allocation pointer of zero corresponds with instances in which no mantissa values are encoded for a sample, because the power spectral density value fell below the level of the masking curve or the absolute hearing threshold. A bit allocation pointer of 1 corresponds with a 3-level symmetric quantization process. Bit allocation pointers of 2-5 correspond with a 5-level, 7-level, 11-level and 15-level symmetric quantization processes. Bit allocation pointers of 6-16 correspond with $2^n$-level asymmetric quantization processes, where n may be an integer in the range of 5-12, 14 or 16.

Figure 3A:
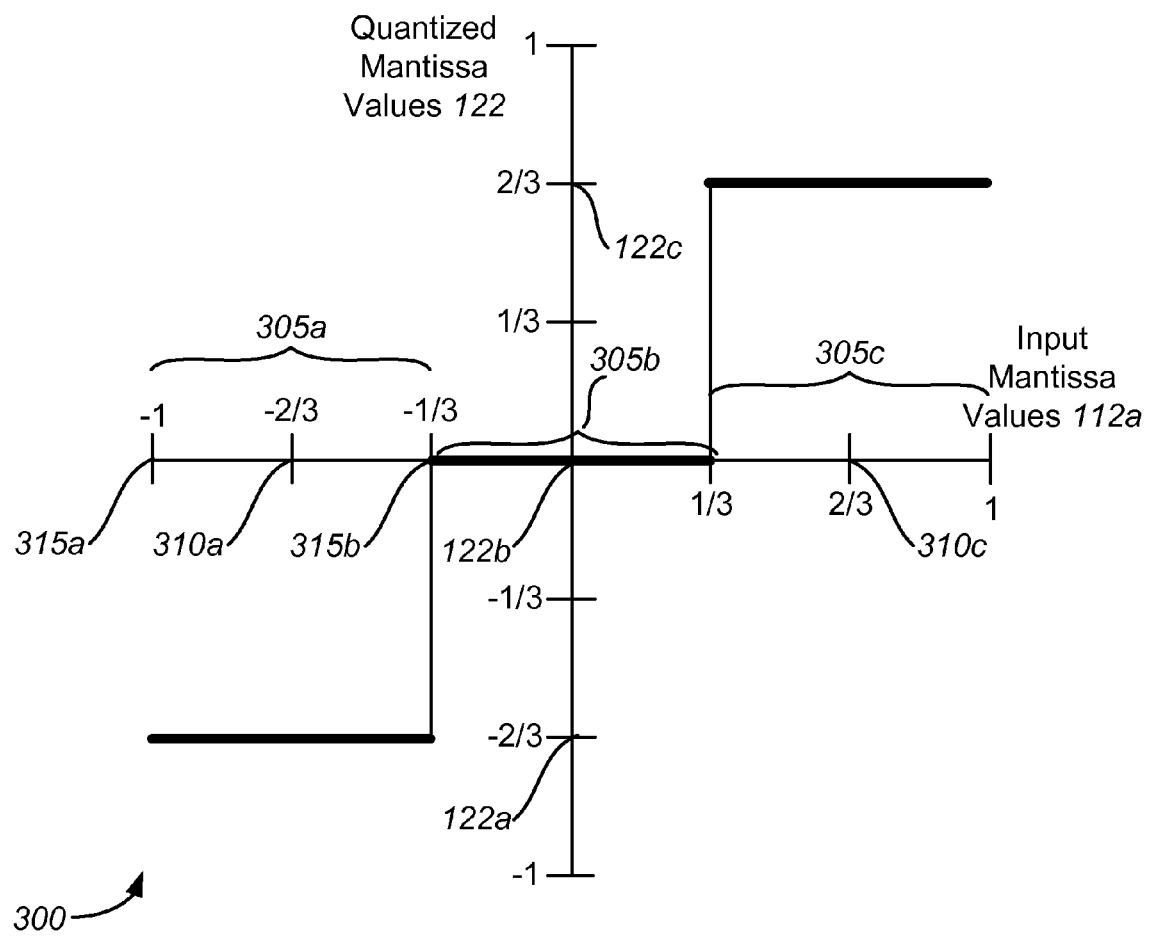
FIG. 3A is a graph that depicts an example of a 3-level symmetrical quantization process.

FIG. 3A is a graph that depicts an example of a 3-level symmetrical quantization process. In this example, the quantization intervals 305 are uniform: the quantization intervals 305*a*, 305*b* and 305*c* are each 2/3. The midpoints 310 may be determined with reference to the boundaries 315 of the quantization intervals 305. For example, the midpoint 310*a* is midway between the boundaries 315*a* and 315*b* of the quantization interval 305*a*.

In graph 300, the quantization values 122 that are applied during the mantissa quantization process 116 correspond to the midpoints 310 of the quantization intervals 305. For example, the midpoint 310*a* of the quantization interval 305*a* is −2/3, which corresponds to the quantized mantissa value 122*a*. Similarly, the midpoint 310*c* of the quantization interval 305*c* is 2/3, which corresponds to the quantized mantissa value 122*c*.

Alternative quantization processes 116 may or may not involve the application of uniform quantization intervals 305. Moreover, alternative quantization processes 116 may or may not involve a correspondence between the quantization values 320 and the midpoints 310 of the quantization intervals 305. Parameters for one such alternative quantization process 116 are shown in FIG. 3B.

Figure 3B:
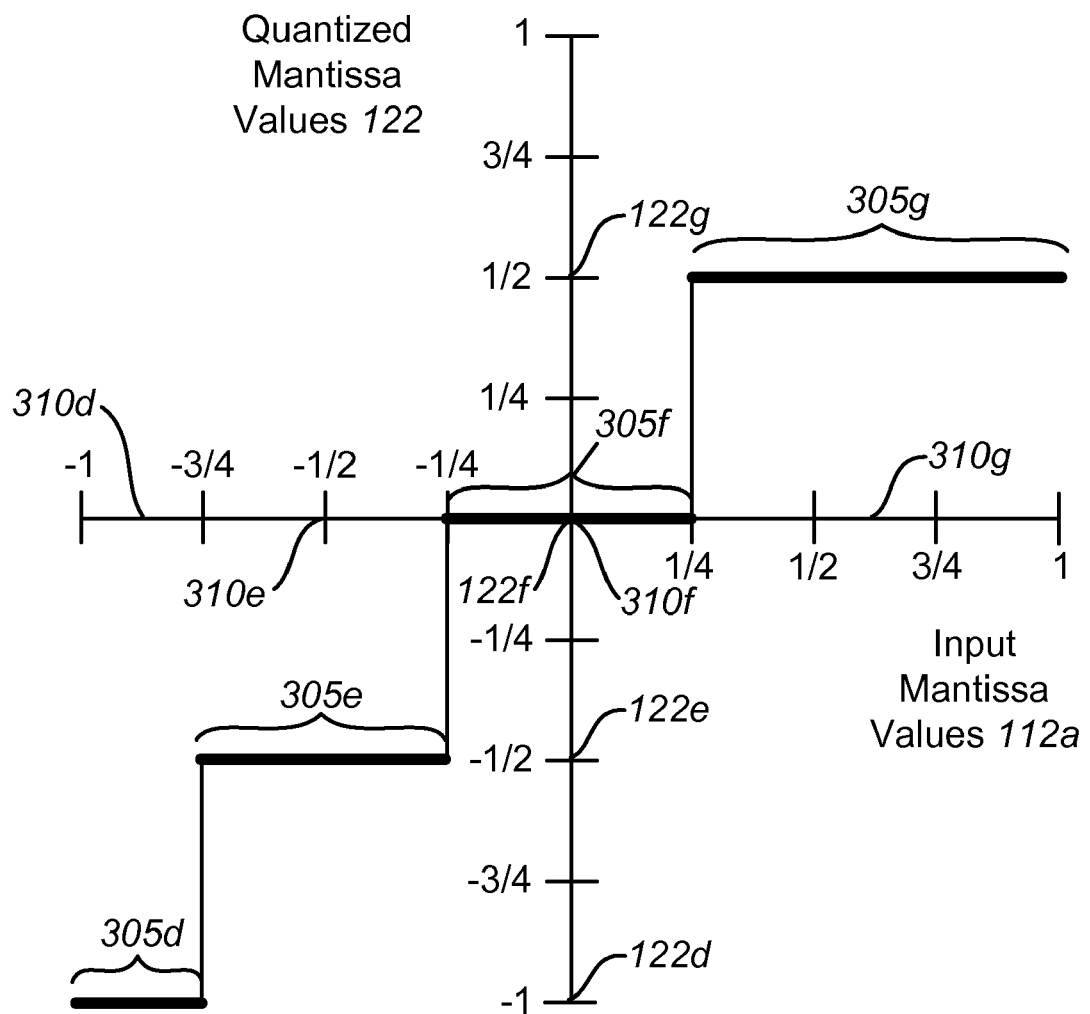
FIG. 3B is a graph that depicts an example of a 4-level asymmetrical quantization process.

FIG. 3B is a graph that depicts an example of a 4-level asymmetrical quantization process. In this example, the quantization intervals 305 range from ¼ (see the quantization interval 305*d*) to ¾ (see the quantization interval 305*g*). The quantization intervals 305*e* and 305*f* are ½ in this example. For the quantization intervals 305*e* and 305*f*, the midpoints 310*e* and 310*f* correspond with the quantized mantissa values 122*e* and 122*f*. However, the midpoints 310*d* and 310*g* of the quantization intervals 305*d* and 305*g* do not correspond with the quantized mantissa values 122*d* and 122*g*.

Some alternative non-uniform quantization processes 116 involve vector quantization. Some vector quantization methods allow a multidimensional data vector to be represented by a single code word. The code word may correspond with a specific vector of a predefined data structure (e.g., a table) of vectors. The length of the code word may depend on the number of vectors in the data structure: relatively more vectors may correspond with a relatively longer code word.

For example, some quantization processes 116 of Dolby Digital Plus involve vector quantization wherein a code word may range from 2 and 9 bits. A single code word may be used to represent each mantissa vector. A Dolby Digital Plus encoder may select an appropriate table of vectors based on a signal-to-mask ratio for a mantissa vector. Within the table, the encoder may determine which vector most closely matches the mantissa vector. A code word that corresponds with a table index for the best-matching vector may be included in the encoded frame 130. Using the code word, a decoder can restore the quantized mantissa values by extracting the vector corresponding to the code word from the appropriate table. Additional implementations of the mantissa quantization process 116 will be described below.

Figure 4:
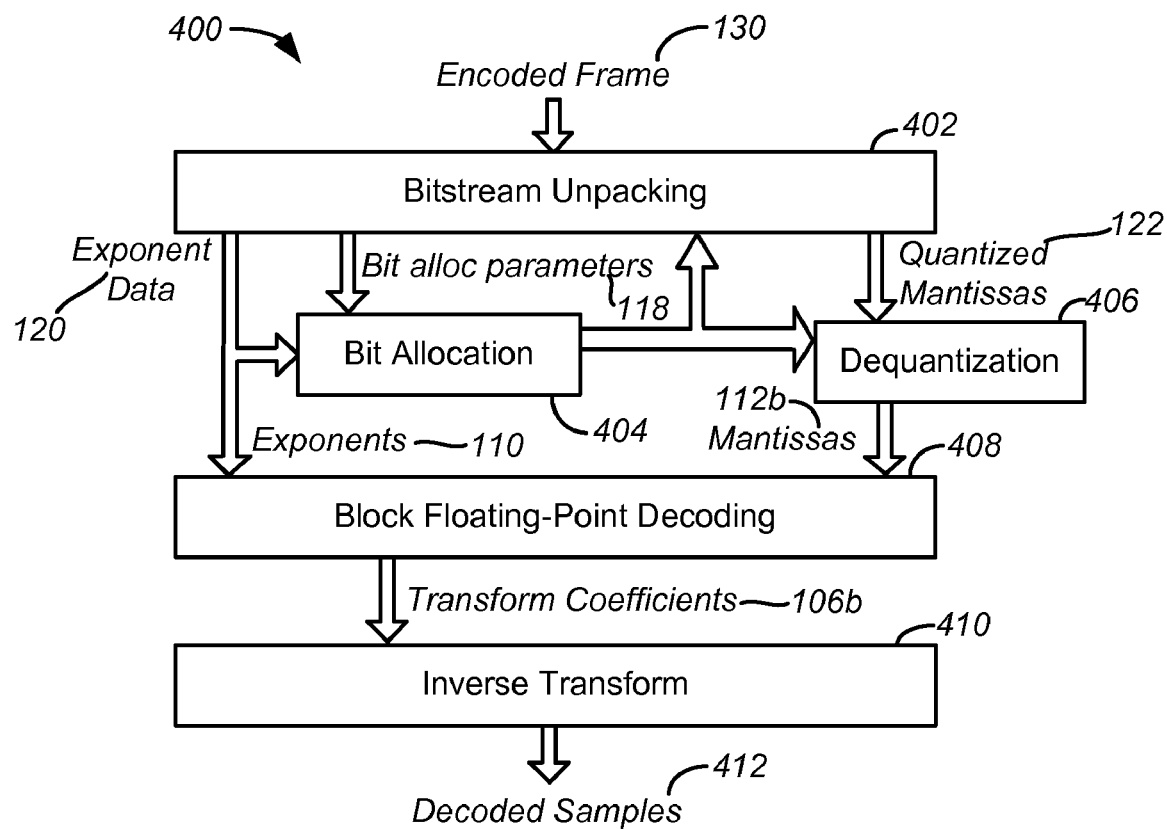
FIG. 4 is a flow diagram illustrating an example of an audio decoding process.

FIG. 4 is a flow diagram illustrating an example of an audio decoding process. Broadly speaking, the audio decoding process 400 involves undoing what has been done during the audio encoding process 100. In some implementations, the audio decoding process 400 is substantially the mirror image of the audio encoding process 100.

The audio decoding process 400 begins when a decoder receives an encoded frame 130. For example, the process may begin when a decoding device receives a plurality of encoded frames 130 via an interface, such as a network interface. Alternatively, or additionally, a logic system of a decoding device may receive the encoded frames 130 via an interface between the logic system and a memory device.

During the bitstream unpacking process 402, the exponent data 120 and the quantized mantissa values 122 are extracted from the encoded frames 130. In some implementations, the bit allocation parameters 118 (or other data that correspond with quantizer resolution) are also included in the encoded frames 130. Bit allocation values may be computed from the bit allocation parameters 118 in the bit allocation process 404. The quantized mantissa values 122 are dequantized in the mantissa dequantization process 406 to produce the mantissa values 112b. The bit allocation parameters 118 may include quantizer resolution data that indicate a number of quantization intervals to use during the mantissa dequantization process 406. However, in some implementations the bit allocation parameters 118 are not included in the encoded frame 130. The bit allocation parameters 118 (or other data that correspond with quantizer resolution) may be computed by the decoder from exponent data, masking curve offset data, etc., that are included in the encoded frame. Because the mantissa quantization process 116 is a lossy process, the mantissa values 112b are not necessarily the same as the mantissa values 112a that were input to the mantissa quantization process 116. Some novel variations of the mantissa dequantization process 406 will be described below.

During the block floating-point decoding process 408, the mantissa values 112b and the corresponding exponent values 110 are converted from a floating point representation to a fractional representation of the transform coefficients 106b. The output from block floating-point decoding process 408 may be constrained within certain values. For example, the values of the transform coefficients 106b may be constrained between −1.0 and 1.0.

In the inverse transform process 410, the transform coefficients 106b in the frequency domain are transformed into the decoded samples 412 in the time domain. In some such examples, the inverse transform process 410 involves an inverse MDCT of the transform coefficients 106b to produce the decoded samples 412. However, alternative implementations may involve other inverse transform methods, such as fast Fourier transforms, or synthesis filterbanks (i.e., inverse-QMF).

Figure 5:
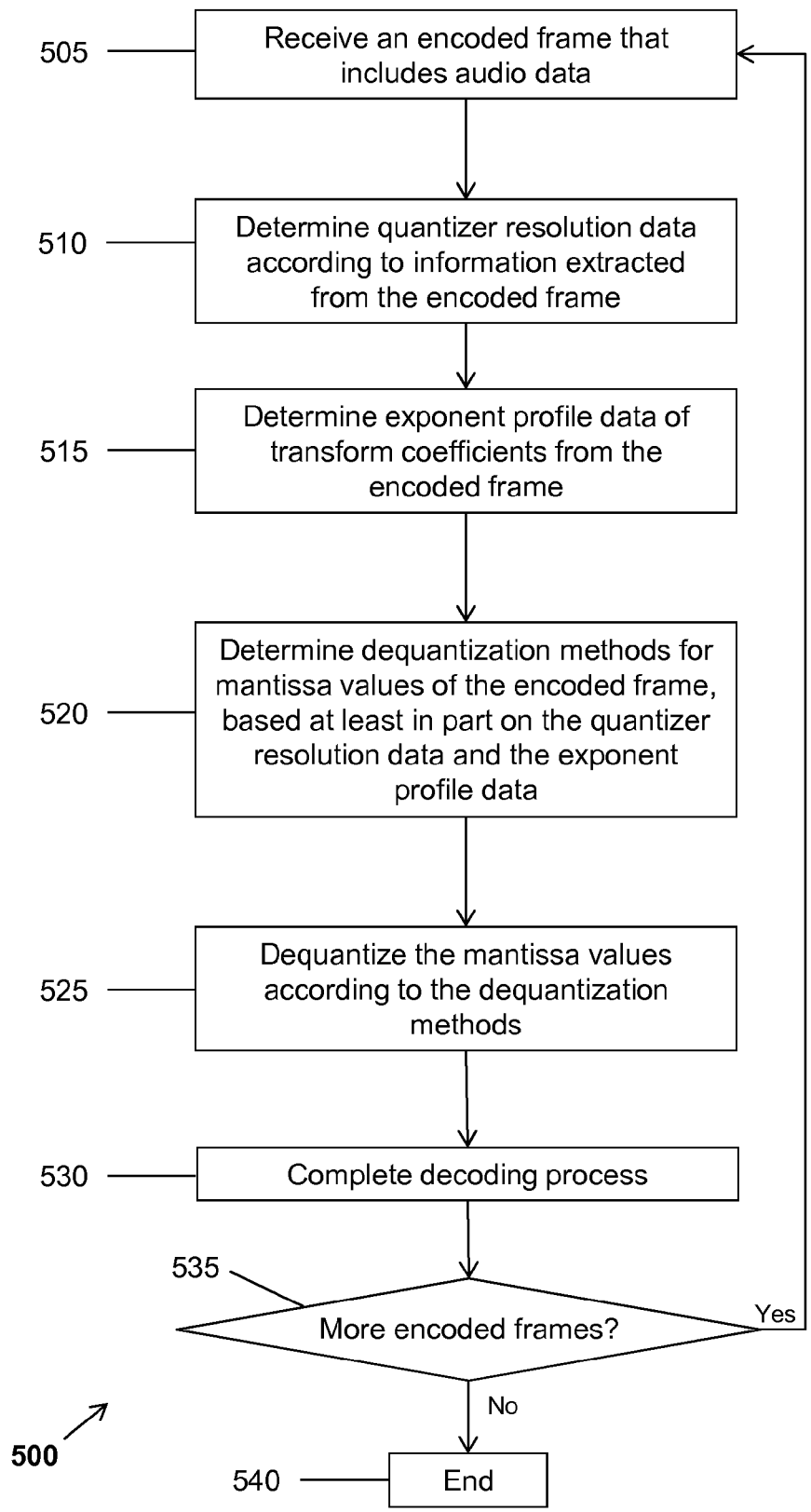
FIG. 5 is a flow diagram illustrating an example of an alternative audio decoding process involving conditional inverse quantizers.

FIG. 5 is a flow diagram illustrating an example of an alternative audio decoding process involving conditional inverse quantizers. In some implementations, the audio decoding process 500 may be similar to the audio decoding process 400 described above. However, the audio decoding process 500 involves novel dequantization methods and related processes. As with other methods described herein, the blocks of the audio decoding process 500 may or may not be performed in the sequence indicated. For example, in some implementations block 515 may be performed before block 510, or blocks 510 and 515 may be performed at substantially the same time.

In this example, the audio decoding process 500 begins when one or more encoded frames that include audio data are received by a decoder (block 505). For example, the process may begin when a decoding device receives an encoded frame (or a plurality of encoded frames) via an interface. In some implementations, the encoded frame may be substantially similar to the encoded frames 130 as described above, and may be in AC-3 format, Enhanced AC-3 format or another audio codec known to those of ordinary skill in the art. However, as discussed below, in some implementations the encoded frame may have been encoded according to novel processes described herein. According to some such implementations, mantissa reconstruction may be conditioned upon exponent information.

Figure 10:
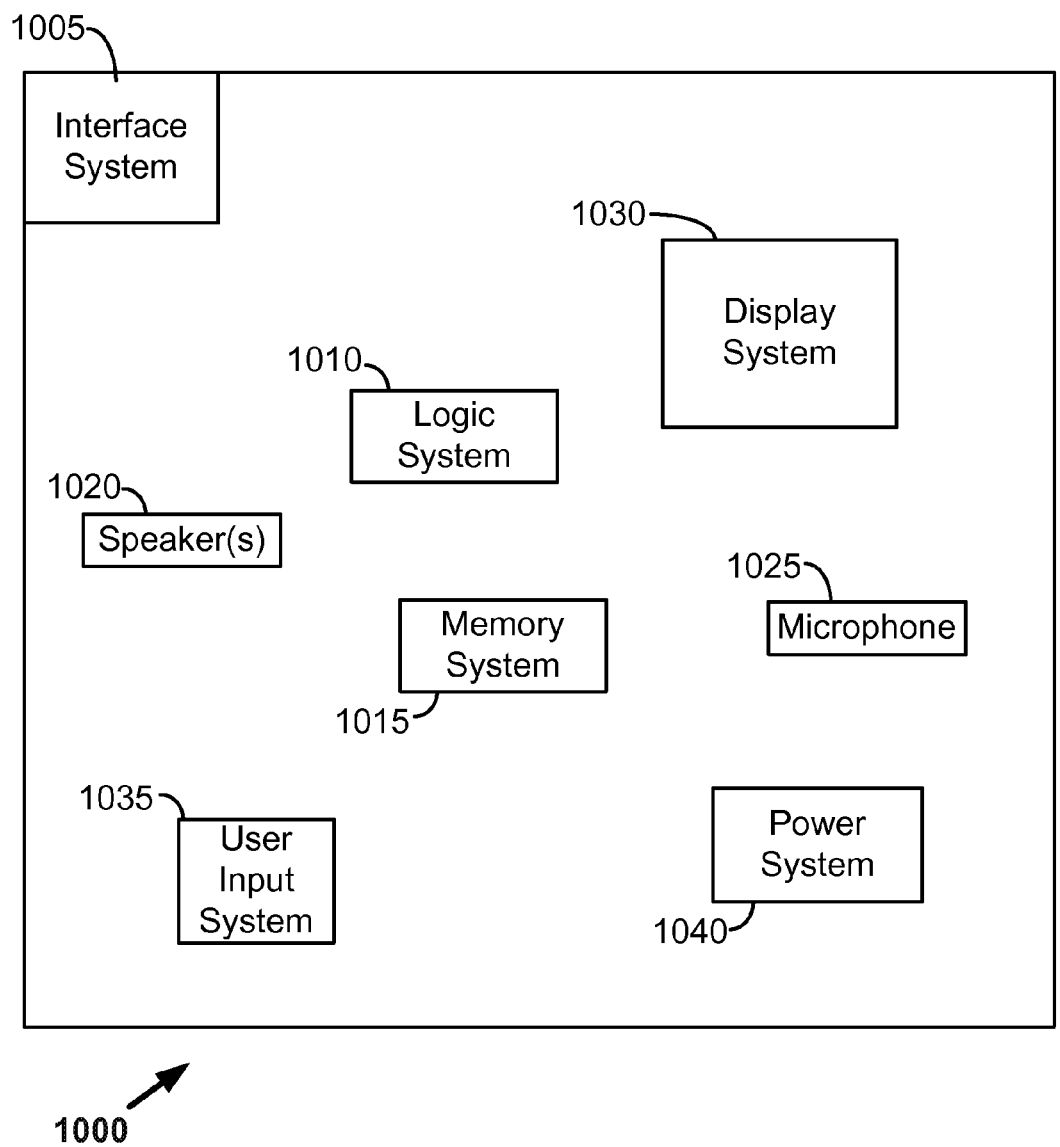
FIG. 10 is a block diagram that provides examples of components of an encoder or decoder apparatus.

The interface by which the encoded frame is received may be a network interface. Alternatively, or additionally, the logic system may receive the encoded frame via an interface between the logic system and a memory device. Examples of components of an encoder or decoder apparatus are shown in FIG. 10 and will be described below.

In block 510, quantizer resolution data are extracted from the encoded frame, or determined in response to other information included in the frame. The quantizer resolution data may correspond to a number of quantization intervals used during a process of quantizing mantissa values of transform coefficients for the audio data of the encoded frame. The quantization intervals may or may not be uniform quantization intervals, depending on the mantissa quantization process. Similarly, the quantization values used during the mantissa quantization process may or may not correspond to midpoints between boundaries of quantization intervals, depending on the mantissa quantization process.

As noted above with reference to FIG. 1, the quantizer resolution that is applied during the mantissa quantization process 116 may be proportional to the signal-to-mask ratio. The bit allocation parameters 118 that are included in the encoded frame 130 may correspond with this quantizer resolution. Accordingly, the bit allocation parameters 118 of the encoded frame 130 may include quantizer resolution data that correspond with a number of quantization intervals used during the mantissa quantization process 116.

In some implementations, the quantizer resolution data may include a bit allocation pointer. As noted above, Dolby Digital includes 16 possible quantizer resolutions, each of which corresponds to a bit allocation pointer that is determined in response to data in the encoded frame 130. A bit allocation pointer of zero corresponds with instances in which no mantissa values are encoded for a sample, because the power spectral density value fell below the level of the masking curve or the absolute hearing threshold. A bit allocation pointer of 1 corresponds with a 3-level symmetric quantization process. Bit allocation pointers of 2-5 correspond with a 5-level, 7-level, 11-level and 15-level symmetric quantization processes. Bit allocation pointers of 6-16 correspond with $2^n$-level asymmetric quantization processes, where n may be an integer in the range of 5-12, 14 or 16.

In block 515, exponent profile data of transform coefficients are extracted from the encoded frame, or determined according to exponent information included in the frame. In some implementations, the exponent profile data will include exponent differential data. In such implementations, the exponent differential data may be determined substantially as described above with reference to the differential exponent values 255 (see FIGS. 2A and 2B and the corresponding discussion). In some such implementations, the differential exponent values 255 may be constrained to fall within a range from −2 to 2 and may have 5 possible states: −2, −1, 0, 1 or 2.

In block 520, dequantization methods for mantissa values of the encoded frame are determined, at least in part, according to the quantization resolution data and the exponent profile data. In some implementations, at least some of the dequantizing methods may involve the application of dequantization values that are different from the quantization values used during the process of quantizing mantissa values of the encoded frame. For example, even if the quantization values used during the quantizing process were midpoints between the boundaries of quantization intervals, at least some of the dequantizing methods may involve the application of dequantization values that do not correspond to midpoints between the boundaries of quantization intervals. The reasoning behind such implementations will now be explained with reference to FIGS. 6A-6D.

Figure 6A:
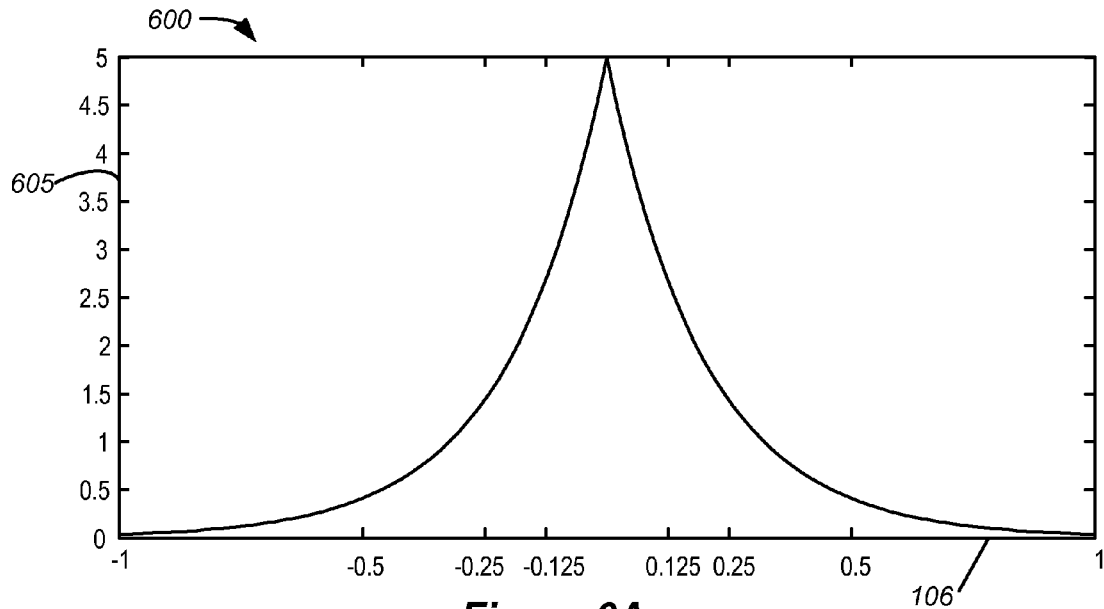
FIG. 6A is a graph that shows an example of a probability density function of transform coefficient values.

FIG. 6A is a graph that shows an example of a probability density function of transform coefficient values. In graph 600, the axis 605 represents the probability density $p_x(x)$ for each of the corresponding values of the transform coefficient 106. The highest probability density value corresponds with a value of zero for the transform coefficient 106. In this example, the probability density values decline as the absolute value of the transform coefficient 106 increases. In this example, the absolute value of the transform coefficient 106 is less than or equal to 1.

Figure 6B:
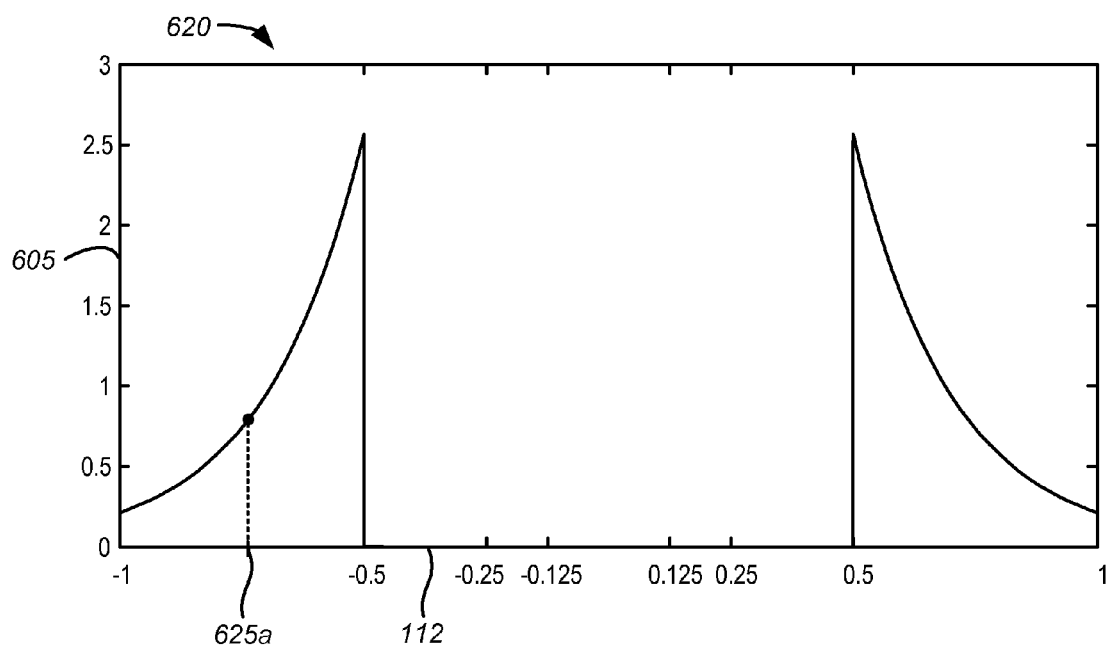
FIGS. 6B-6D are graphs of probability density functions for mantissas of the transform coefficients of FIG. 6A and selected exponent values.
Figure 6C:
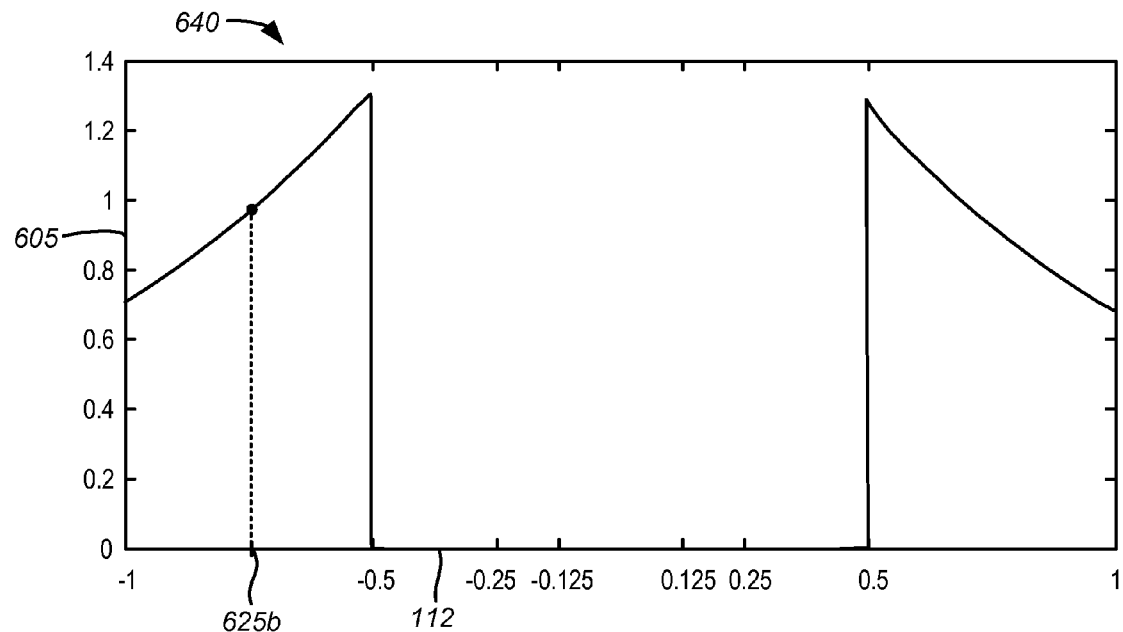
Figure 6D:
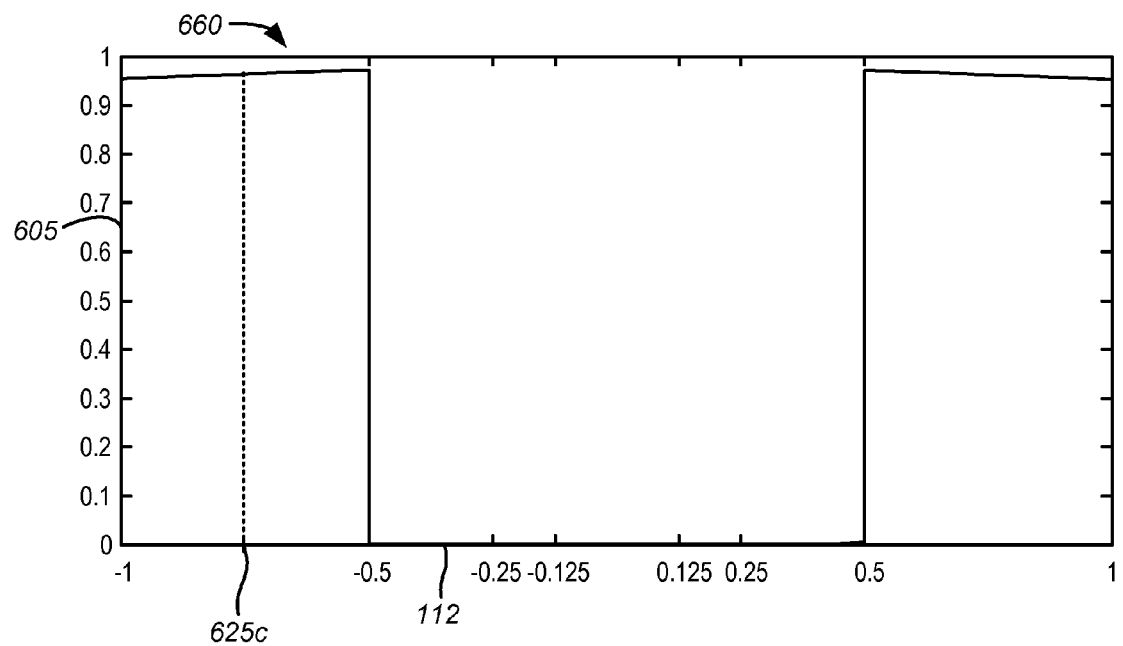

FIGS. 6B-6D are graphs of probability density functions for mantissas of the transform coefficients of FIG. 6A and selected exponent values. Each of these graphs is based on the following equation derived from the example pdf of FIG. 6A:

$$p_{Y|K}(y|k) = \begin{cases} c2^k p_x(y2^{-k}) & 0.5 < |y| \leq 1 \\ 0 & \text{otherwise} \end{cases} \quad \text{(Equation 2)}$$

In Equation 2, $P_{y|k}(y|k)$ represents the probability density function of the mantissa y conditioned on the exponent value k. As noted above in the discussion of Equation 1, the mantissa values may (as here) be constrained to be greater than or equal to 0.5 and less than or equal to 1.0.

In FIG. 6B k=0, whereas k=2 in FIG. 6C and k=7 in FIG. 6D. Referring first to FIG. 6B, it may be seen that when k=0, it will often be the case that setting a quantization value (or a dequantization value) as the midpoint between the boundaries of quantization intervals will not be optimal, in that it will not result in minimizing an error metric, such as the minimum mean square quantization error. However, as the value of k increases, the mantissa statistics within a quantizer interval becomes uniform enough that the optimum (in terms of minimizing the mean squared error) reconstruction for the quantizer intervals is almost the same as its mid-point, i.e., the average quantization error due to setting the reconstruction as the mid-point of the interval is almost the same as that of setting the reconstruction to its optimal value in terms of minimizing the mean squared error. Other error metrics may be used, such as the mean absolute quantization error.

The foregoing analysis suggests that for a given quantizer resolution data value, a different value of k may indicate whether a dequantization value should correspond with a midpoint between the boundaries of a quantization interval. However, audio data are often highly variable over time and therefore $p_x(x)$ may often be highly variable over time. Audio data may have similar variations over the frequency spectrum. Accordingly, absolute exponent values may not be consistent and reliable indicators of mantissa statistics.

In order to account for such variations in time and frequency, in some implementations the mantissa dequantization method for each frequency bin may be based, at least in part, on differential exponent values and/or trends of exponent values. Such trends may be determined by comparing two or more differential exponent values for sequential frequency bins. According to some such implementations, the mantissa dequantization method for each frequency bin may be determined according to the quantization resolution data and an exponent difference pair. Some such implementations will now be described with reference to FIG. 7.

Figure 7:
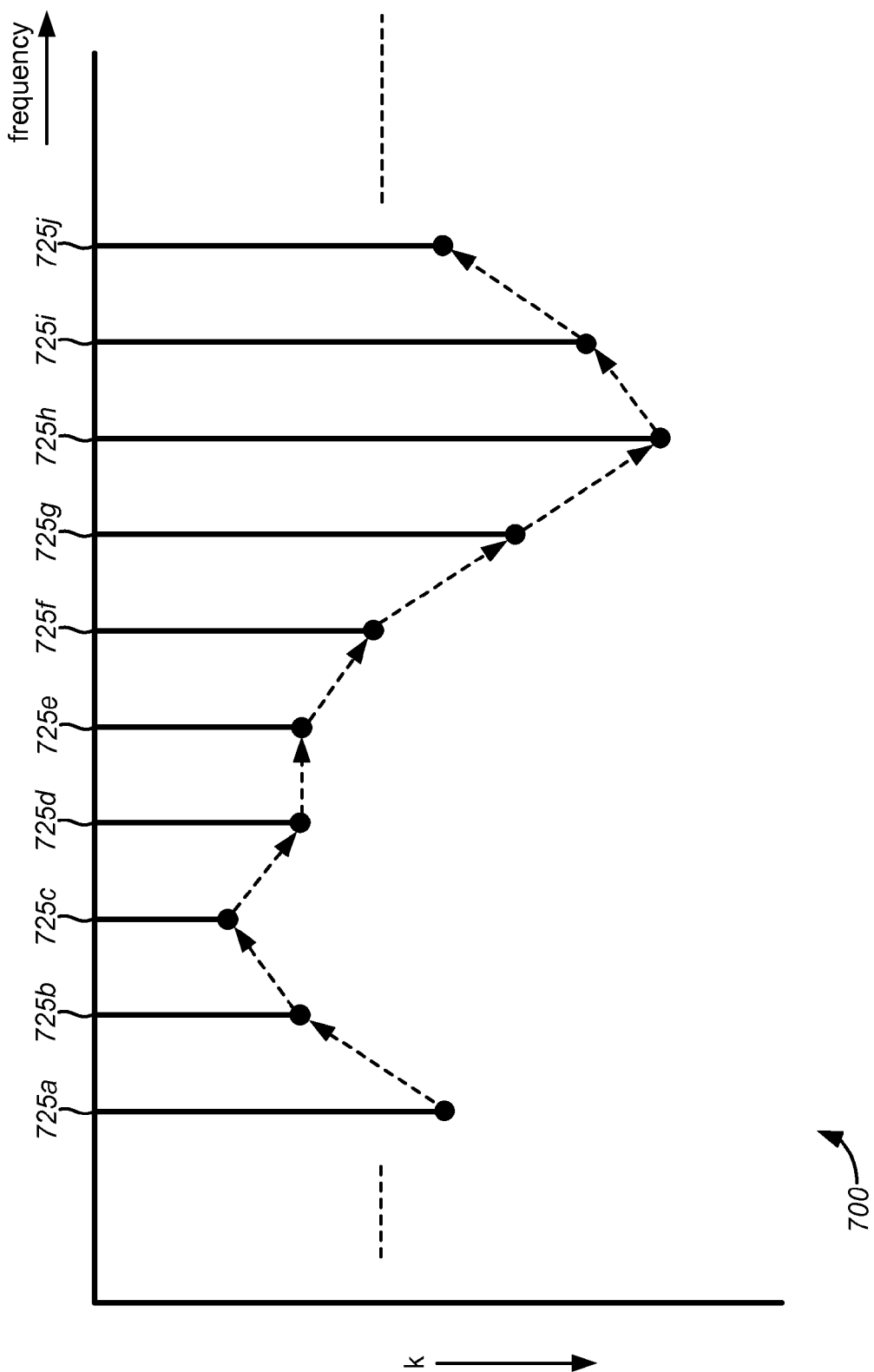
FIG. 7 is a graph that indicates an example of exponent values at various frequencies.

FIG. 7 is a graph that indicates an example of exponent values at various frequencies. Because the value of a transform coefficient is inversely proportional to the value of the exponent values, k increases in a downward direction in the graph 700. The values of k for various frequency bins 725 are shown. In some implementations, an exponent difference pair for each frequency bin 725 will be a first exponent difference relative to an exponent for a lower frequency and a second exponent difference relative to an exponent for a higher frequency.

For example, the exponent difference pair for the frequency bin 725b will be a first exponent difference relative to the exponent value for the frequency bin 725a and a second exponent difference relative to the exponent value for the frequency bin 725c. The first exponent difference may be referred to herein as a "backward exponent diff" and the second exponent difference may be referred to herein as a "forward exponent diff." The terms "diff" and "difference" may be used interchangeably herein.

By considering at least the backward exponent diff and the forward exponent diff for each frequency bin, a determination may be made as to how the exponent values are trending. For example, the backward exponent diff and the forward exponent diff for the frequency bins 725b and 725i indicate upward slopes, wherein the k values are declining. The backward exponent diff and the forward exponent diff for the frequency bin 725c indicate a spectral peak, which corresponds to a local maximum value of the transform coefficient for the frequency bin 725c. For such values, the distribution of the mantissas tends to be skewed. Therefore (as in the case described above with reference to FIG. 6B wherein k=0), setting a dequantization value as the midpoint between the boundaries of quantization intervals will generally not be optimal.

The backward exponent diff and the forward exponent diff for the frequency bins 725f and 725g indicate a downward slope. The backward exponent diff and the forward exponent diff for the frequency bin 725h indicate a valley or trough. As with spectral peaks, such trends in exponent data also may correspond with mantissa statistics.

Figure 8:
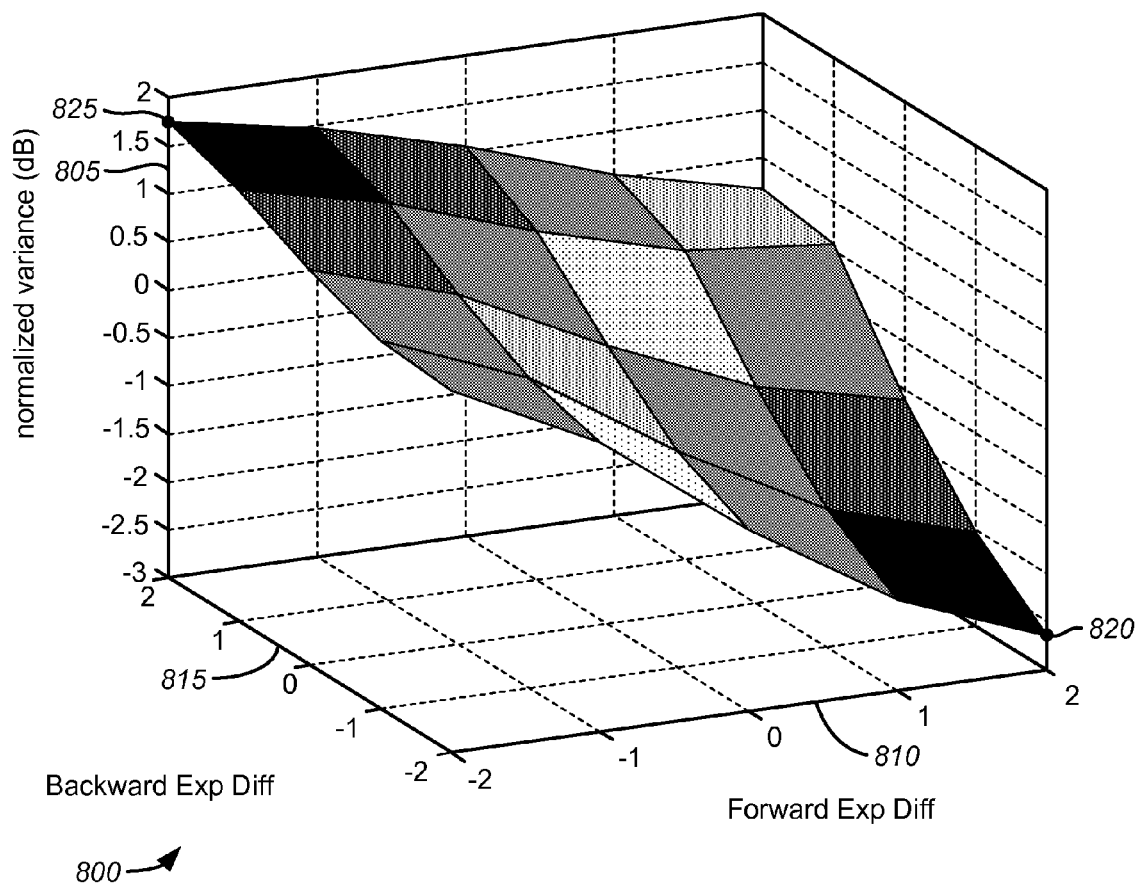
FIG. 8 is a diagram that depicts an example of normalized mantissa variance according to backward exponent differentials and forward exponent differentials.

FIG. 8 is a diagram that depicts an example of normalized mantissa variance of actual audio data according to backward exponent differentials and forward exponent differentials. The results depicted in graph 800 represent the results for particular types of audio data used to date. In this example, the vertical axis 805 of graph 800 indicates normalized mantissa variance, in decibels. The axis 810 indicates forward exponent diffs and the axis 815 indicates backward exponent diffs. In this example, the exponent differential data have 5 different states corresponding to integers that range from −2.0 to 2.0, inclusive. Therefore, the exponent pairs include 25 different possible combinations.

The point 820 corresponds to an exponent difference pair of (−2, 2), which in turn corresponds to a sharp spectral peak. The point 820 corresponds to a normalized mantissa variance of about −2.5 dB in this example, the lowest variance of any of the exponent difference pairs. In graph 800, a lower variance corresponds to a relatively less uniform distribution of probability density values across the range of possible mantissa values. The less uniform that the distribution is, the more likely it is that the mantissa values will be relatively more skewed. Therefore, setting a dequantization value as the midpoint between the boundaries of quantization intervals will generally be less optimal.

At the other extreme, the point 825 corresponds to an exponent difference pair of (2, −2), which corresponds to a sharp spectral valley. The point 825 has a normalized mantissa variance of about 1.7 dB in this example, the highest variance of any of the exponent difference pairs. In graph 800, a higher variance corresponds to a relatively more uniform distribution of probability density values across the range of possible mantissa values. A more uniform distribution of probability density values means that setting a dequantization value as the midpoint between the boundaries of quantization intervals is more likely to provide satisfactory results.

Referring again to FIG. 5, in some implementations the mantissa dequantization methods for each frequency bin in block 520 may be determined (at least in part) according to the quantization resolution data and an exponent difference pair corresponding to the frequency bin. Block 520 may involve determining an exponent difference pair, including a backward exponent diff and a forward exponent diff, for each frequency bin. In some implementations, the exponent profile data extracted from the encoded frame (see block 515) may include differential exponent values. Such implementations further streamline the process of determining the exponent difference pair.

Each of the exponent difference pairs may correspond with a dequantization method. Block 520 may involve obtaining a dequantization method for a particular frequency bin by referencing a data structure of exponent difference pairs and corresponding dequantization methods. Block 520 may involve retrieving, from the data structure, an indication of a dequantization method that corresponds with the exponent difference pair for the frequency bin. In some implementations, the data structure will correspond with the quantization resolution data for the frequency bin. For example, the data structure may correspond with a particular bit allocation pointer value.

The exponent profile data extracted from the encoded frame (see block 515) may include exponent values for which there are no corresponding mantissa values in the encoded frame. For example, zero bits may have been allocated to such mantissa values during the mantissa quantization process. In some implementations, the associated exponent data may nonetheless be used to determine a dequantization method for the corresponding mantissa values. Instead of assigning a random mantissa value, a mantissa value for a frequency bin may be reconstructed according to the dequantization method that corresponds with an exponent difference pair and quantization resolution data for the frequency bin.

In block 525, the mantissa values corresponding to each frequency bin are dequantized according to the dequantization methods determined in block 525 and the corresponding quantization resolution data. At least some of these dequantization methods may differ from quantization methods used in the encoding process. For example, the quantization values used in the encoding process may have been midpoints between boundaries of quantization intervals, whereas at least some of these dequantization methods determined in block 520 and applied in block 525 may not involve applying dequantization values that correspond to midpoints between boundaries of quantization intervals. However, in some encoding methods described herein, the quantization values are not necessarily midpoints between boundaries of quantization intervals.

In block 530, the decoding process for the frame is completed. Block 530 may involve reconstructing absolute exponent values corresponding to the dequantized mantissa values. Block 530 may involve a block floating-point decoding process wherein the dequantized mantissa values and the corresponding exponent values are converted from a floating point representation to a fractional representation of the transform coefficients. Block 530 may involve an inverse transform process, wherein the transform coefficients in the frequency domain are transformed into decoded samples in the time domain.

In block 535, it is determined whether any remaining encoded frames need to be processed. If so, the process reverts to block 505 in this example. If not, the process ends (block 540).

Figure 9:
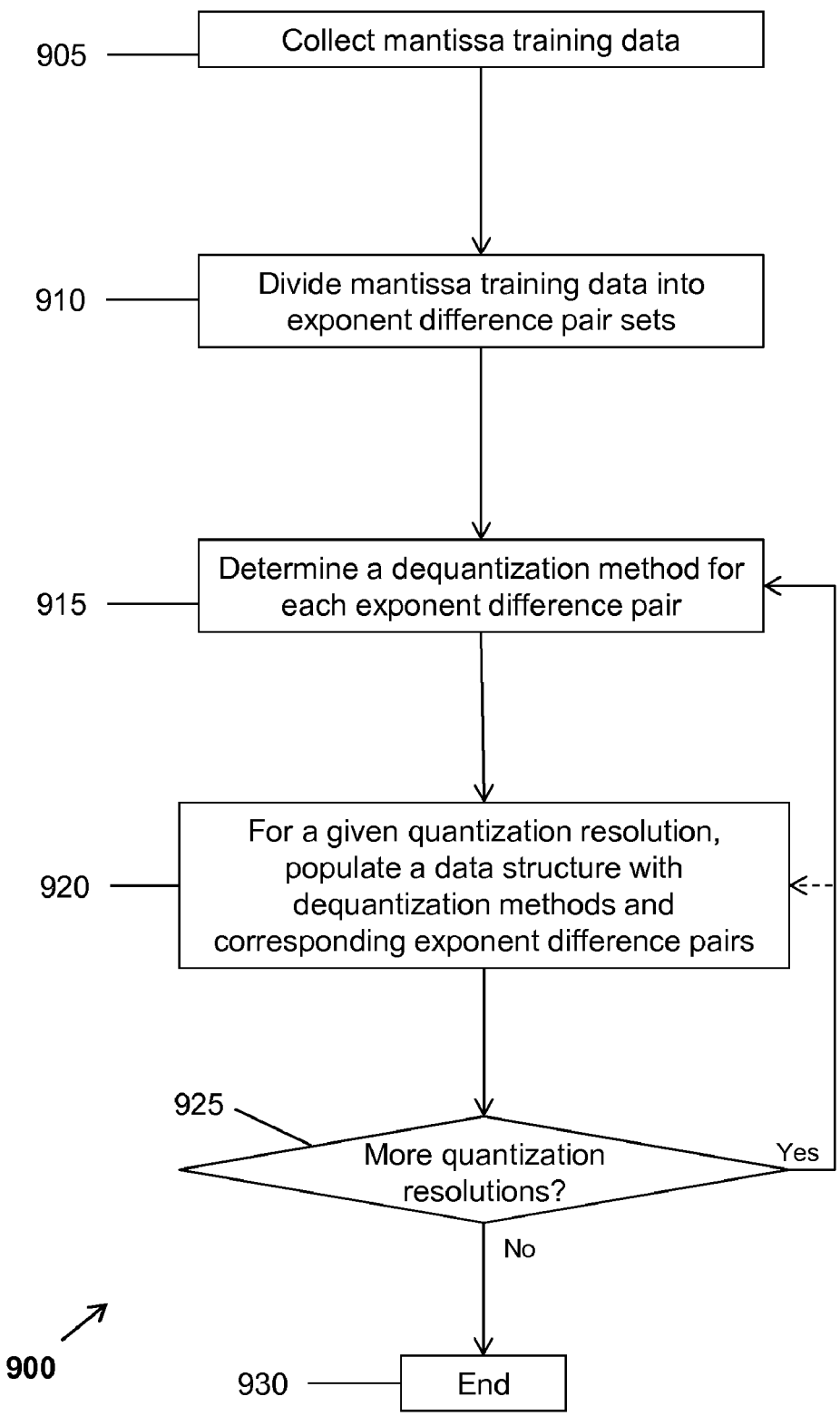
FIG. 9 is a flow diagram that shows an example of a process of establishing parameters for a method of audio decoding with conditional inverse quantizers.

FIG. 9 is a flow diagram that shows an example of a process of establishing parameters for a method of audio decoding with conditional inverse quantizers. Method 900 begins with block 905, wherein mantissa training data are collected. Such training data may include various types of audio data, such as audio data for a variety of different musical styles, audio data for various movie sound tracks, audience applause data, ambient audio data, combinations thereof, etc.

In block 910, the mantissa training data are divided into exponent difference pair sets. For example, the mantissa training data may be transformed from the time domain into the frequency domain. A block floating-point encoding process may be applied to the data to produce mantissa values and corresponding absolute exponent values. Differential exponent values may be computed for the absolute exponent values. Pairs of differential exponent values may be associated with mantissa values at each of a plurality of frequency bins.

A dequantization method may then be determined for each exponent difference pair (block 915). The quantization methods may also correspond to a particular quantization resolution. For example, different dequantization methods may be determined for mantissas quantized according to a 3-level symmetric quantization method, a 5-level symmetric quantization method, a 7-level symmetric quantization method and/or other quantization methods. Some such dequantization methods may involve applying dequantization values that do not correspond with midpoints between the boundaries of quantization intervals used in these quantization methods. Instead, the dequantization values may correspond with statistics determined from the mantissa training data. However, other dequantization methods may involve applying dequantization values that correspond with such midpoints.

In block 920, a data structure is populated for each quantization resolution. The data structure may include dequantization methods and corresponding exponent difference pairs. The data structures may be saved in a memory. In block 925, it is determined whether dequantization methods will be determined for additional quantization resolutions. If so, the process may revert to block 915 or 920. If not, the process ends (block 930).

It should be noted that process 900 is merely one example of a design process for the conditional inverse quantizers. In this example, the exponent profile data on which the inverse quantizers are conditioned comprises exponent difference pair sets. However, as noted elsewhere herein, in alternative implementations the inverse quantizers may be conditioned on other types of exponent profile data. For example, in alternative implementations the exponent profile data may include more than two exponent difference values for each frequency bin. When the inverse quantizers are conditioned on a different type of exponent profile data, then the steps of FIG. 9 are to be modified accordingly. For instance, in block 910 the training data may be divided into smaller groups, each corresponding to a particular value of the alternative exponent profile data.

Various decoding methods described herein may be used with audio data that has been encoded according to existing codecs, including but not limited to Dolby Digital and Dolby Digital Plus. However, some implementations disclosed herein provide novel quantization and dequantization methods.

According to some such implementations, the selection of quantization interval boundaries and/or quantization values may vary, even for the same quantization resolution. In some such implementations, an encoding device's selection of quantization interval boundaries and/or quantization values may be conditioned upon exponent information, such as the exponent difference pairs for a particular frequency bin. The encoding device may determine quantization interval boundaries and/or quantization values associated with the exponent difference pairs according to mantissa training data, which may be based on actual audio data. A decoding device may, for example, dequantize encoded audio data according to corresponding dequantization interval boundaries and/or dequantization values.

The design of conditional quantizers for the novel encoders described herein may involve a process similar to process 900, which is described above with reference to FIG. 9. However, in such implementations step 915 may be appropriately modified to determine quantization methods instead of, or in addition to, dequantization methods. According to some such implementations, step 920 may be modified to populate a data structure that includes quantization methods instead of, or in addition to, dequantization methods.

Such novel encoding techniques provide encoded audio data that is suitable for use not only by the novel decoding devices described herein, but also by legacy decoding devices.

FIG. 10 is a block diagram that provides examples of components of an encoder or decoder apparatus. The device 1000 may be a mobile telephone, a smartphone, a desktop computer, a hand-held or portable computer, a netbook, a notebook, a smartbook, a tablet, a stereo system, a television, a DVD player, a digital recording device, or a variety of other devices.

In this example, the device includes an interface system 1005. The interface system 1005 may include a network interface, such as a wireless network interface. Alternatively, or additionally, the interface system 1005 may include a universal serial bus (USB) interface or another such interface.

The device 1000 includes a logic system 1010. The logic system 1010 may include a processor, such as a general purpose single- or multi-chip processor. The logic system 1010 may include a digital signal processor (DSP), an application specific integrated circuit (ASIC), a field programmable gate array (FPGA) or other programmable logic device, discrete gate or transistor logic, or discrete hardware components, or combinations thereof. The logic system 1010 may be configured to control the other components of the device 1000. Although no interfaces between the components of the device 1000 are shown in FIG. 10, the logic system 1010 may be configured for communication with the other components. The other components may or may not be configured for communication with one another, as appropriate.

The logic system 1010 may be configured to perform encoder and/or decoder functionality, including but not limited to the types of encoder and/or decoder functionality described herein. In some such implementations, the logic system 1010 may be configured to operate (at least in part) according to software stored on one or more non-transitory media. The non-transitory media may include memory associated with the logic system 1010, such as random access memory (RAM) and/or read-only memory (ROM). The non-transitory media may include memory of the memory system 1015. The memory system 1015 may include one or more suitable types of non-transitory storage media, such as flash memory, a hard drive, etc.

For example, the logic system 1010 may be configured to receive frames of encoded audio data via the interface system 1005 and to decode the encoded audio data according to the decoder methods described herein. Alternatively, or additionally, the logic system 1010 may be configured to receive frames of encoded audio data via an interface between the memory system 1015 and the logic system 1010. The logic system 1010 may be configured to control the speaker(s) 1020 according to decoded audio data. In some implementations, the logic system 1010 may be configured to encode audio data according to conventional encoding methods and/or according to encoding methods described herein. The logic system 1010 may be configured to receive such audio data via the microphone 1025, via the interface system 1005, etc.

The display system 1030 may include one or more suitable types of display, depending on the manifestation of the device 1000. For example, the display system 1030 may include a liquid crystal display, a plasma display, a bistable display, etc.

The user input system 1035 may include one or more devices configured to accept input from a user. In some implementations, the user input system 1035 may include a touch screen that overlays a display of the display system 1030. The user input system 1035 may include buttons, a keyboard, switches, etc. In some implementations, the user input system 1035 may include the microphone 1025: a user may provide voice commands for the device 1000 via the microphone 1025. The logic system may be configured for speech recognition and for controlling at least some operations of the device 1000 according to such voice commands.

The power system 1040 may include one or more suitable energy storage devices, such as a nickel-cadmium battery or a lithium-ion battery. The power system 1040 may be configured to receive power from an electrical outlet.

Various modifications to the implementations described in this disclosure may be readily apparent to those having ordinary skill in the art. The general principles defined herein may be applied to other implementations without departing from the spirit or scope of this disclosure. For example, while various implementations have been described in terms of exponent difference pairs, alternative implementations may involve more than two exponent difference values for each frequency bin. Moreover, while various implementations have been described in terms of Dolby Digital and Dolby Digital Plus, the methods described herein may be implemented in conjunction with other audio codecs. Thus, the claims are not intended to be limited to the implementations shown herein, but are to be accorded the widest scope consistent with this disclosure, the principles and the novel features disclosed herein.

What is claimed is:

1. A method, comprising:
   receiving an encoded frame that includes audio data;
   determining quantizer resolution data in response to information extracted from the encoded frame, the quantizer resolution data corresponding to a number of quantization intervals used during a process of quantizing mantissa values of transform coefficients for the audio data of the encoded frame;
   determining exponent profile data of transform coefficients from the encoded frame;

determining a plurality of dequantization methods for the mantissa values of the encoded frame based, at least in part, on the quantizer resolution data and the exponent profile data; and dequantizing the mantissa values according to the dequantization methods.

2. The method of claim 1, wherein the exponent profile data include exponent differential data.

3. The method of claim 2, wherein the exponent differential data correspond to 5 differential states.

4. The method of claim 2, wherein the exponent differential data include exponent difference pairs.

5. The method of claim 4, wherein dequantizing the mantissa values involves dequantizing a mantissa value for a frequency according to a dequantization method that corresponds to an exponent difference pair for the frequency.

6. The method of claim 5, wherein the exponent difference pair for the frequency includes a first exponent difference relative to an exponent for a lower frequency and a second exponent difference relative to an exponent for a higher frequency.

7. The method of claim 1, wherein the quantization intervals used during the process of quantizing mantissa values are uniform quantization intervals.

8. The method of claim 1, wherein quantization values used during the process of quantizing mantissa values correspond to midpoints between boundaries of quantization intervals, and wherein at least some dequantization values do not correspond to midpoints between the boundaries of quantization intervals.

9. The method of claim 1, wherein at least some of the dequantization methods involve the application of dequantization values different from the quantization values used during the process of quantizing mantissa values of the encoded frame.

10. The method of claim 1, wherein the exponent profile data include data for exponents for which there are no corresponding mantissa values in the encoded frame.

11. An apparatus, comprising:
an interface; and
a logic system configured for:
receiving, from the interface, an encoded frame that includes audio data;
determining quantizer resolution data in response to information extracted from the encoded frame, the quantizer resolution data corresponding to a number of quantization intervals used during a process of quantizing mantissa values of transform coefficients for the audio data of the encoded frame;
determining exponent profile data of transform coefficients from the encoded frame;
determining a plurality of dequantization methods for the mantissa values of the encoded frame based, at least in part, on the quantizer resolution data and the exponent profile data; and
dequantizing the mantissa values according to the dequantization methods.

12. The apparatus of claim 11, wherein the encoded frame is in AC-3 format or Enhanced AC-3 format.

13. The apparatus of claim 11, wherein the logic system includes at least one of a general purpose single- or multi-chip processor, a digital signal processor (DSP), an application specific integrated circuit (ASIC), a field programmable gate array (FPGA) or other programmable logic device, discrete gate or transistor logic, or discrete hardware components.

14. The apparatus of claim 11, further comprising a memory device, wherein the interface comprises an interface between the logic system and the memory device.

15. The apparatus of claim 11, wherein the interface comprises a network interface.

16. The apparatus of claim 11, wherein the exponent profile data include exponent differential data.

17. The apparatus of claim 16, wherein the exponent differential data include exponent difference pairs corresponding to each of a plurality of frequencies.

18. The apparatus of claim 16, further comprising memory having a data structure stored thereon, the data structure including a plurality of dequantization methods and corresponding exponent differential data.

19. The apparatus of claim 18, wherein the logic system is configured for determining a dequantization method corresponding to exponent differential data by referencing the data structure.

20. A method, comprising:
receiving first audio data in the time domain;
transforming the first audio data into second audio data in the frequency domain, the second audio data including transform coefficients;
determining exponent data, including exponent profile data, from the transform coefficients;
determining quantizer resolution data in response to the exponent data, the quantizer resolution data corresponding to a number of quantization intervals to be used during a process of quantizing mantissa values of the transform coefficients;
determining a plurality of quantization methods for the mantissa values of the transform coefficients based, at least in part, on the quantizer resolution data and the exponent profile data; and
quantizing the mantissa values according to the quantization methods.

21. The method of claim 20, further comprising forming an encoded frame that includes the second audio data, the exponent data and the quantized mantissa values.

22. The method of claim 20, wherein one or more quantization values used during the process of quantizing mantissa values do not correspond to a midpoint between boundaries of a quantization interval.

23. The method of claim 20, wherein one or more of the quantization methods use quantization intervals with boundaries that are not uniformly spaced.

24. An apparatus comprising:
an interface; and
a logic system configured for:
receiving, from the interface, an encoded frame that includes first audio data in the frequency domain, exponent data and quantized mantissa values, the quantized mantissa values determined according to quantization methods based, at least in part, on quantizer resolution data and exponent profile data determined from the exponent data;
determining dequantized mantissa values from the quantized mantissa values;
determining transform coefficients based in part on the dequantized mantissa values; and
performing an inverse transform operation using the transform coefficients to produce second audio data in the time domain.

25. The apparatus of claim 24, wherein the encoded frame is in AC-3 format or Enhanced AC-3 format.

26. The apparatus of claim 24, wherein the logic system includes at least one of a general purpose single- or multi-chip processor, a digital signal processor (DSP), an application specific integrated circuit (ASIC), a field programmable gate array (FPGA) or other programmable logic device, discrete gate or transistor logic, or discrete hardware components.

27. The apparatus of claim 24, further comprising a memory device, wherein the interface comprises an interface between the logic system and the memory device.

28. The apparatus of claim 24, wherein the interface comprises a network interface.

29. The apparatus of claim 24, wherein one or more of the quantization methods use quantization intervals with boundaries that are not uniformly spaced.

30. The apparatus of claim 24, wherein one or more of the quantization methods use quantization values that do not correspond to a midpoint between boundaries of a quantization interval.

* * * * *